United States Patent
Kim et al.

(10) Patent No.: US 7,214,103 B2
(45) Date of Patent: May 8, 2007

(54) CONNECTING A SOLENOID TO A LEAD FRAME

(75) Inventors: Tae-Kyung Kim, Sterling Heights, MI (US); Kenneth J. Parker, Lake Orion, MI (US); Charles Chang, Rochester, MI (US); Nathan W. Kryglowski, Troy, MI (US); Jeffrey S. Diller, Kimball, MI (US); Mark W. Hildebrandt, Auburn Hills, MI (US); Thomas R. Hildebrandt, Auburn Hills, MI (US); Randy R. Reamsma, Grand Blanc, MI (US); Kelly M. Newby, Riley Township, MI (US)

(73) Assignee: Eaton Corporation, Cleveland, OH (US)

( * ) Notice: Subject to any disclaimer, the term of this patent is extended or adjusted under 35 U.S.C. 154(b) by 286 days.

(21) Appl. No.: 10/722,316

(22) Filed: Nov. 25, 2003

(65) Prior Publication Data

US 2005/0109536 A1 May 26, 2005

(51) Int. Cl.
*H01R 13/64* (2006.01)
(52) U.S. Cl. ............... 439/680; 439/397; 439/252; 439/681; 137/884; 137/315.03
(58) Field of Classification Search ............... 361/808, 361/752; 439/680, 397, 399, 407; 174/260; 310/71, 89; 137/884, 73; 73/756, 315; 251/129.15; 29/890.124; 335/260, 278; 267/140.13, 267/219
See application file for complete search history.

(56) References Cited

U.S. PATENT DOCUMENTS

| | | | | |
|---|---|---|---|---|
| 1,157,026 A | * | 10/1915 | Meschenmoser | 439/252 |
| 4,186,363 A | * | 1/1980 | Schmidt et al. | 335/278 |
| 4,759,730 A | * | 7/1988 | Sappington et al. | 439/622 |
| 5,314,356 A | * | 5/1994 | Isohata et al. | 439/681 |
| 5,460,350 A | * | 10/1995 | Nagashima et al. | 251/129.15 |
| 5,845,672 A | * | 12/1998 | Reuter et al. | 137/315.03 |
| 5,892,659 A | | 4/1999 | Cooper et al. | |
| 6,503,095 B1 | | 1/2003 | Endo et al. | |
| 6,929,031 B2 | * | 8/2005 | Ford et al. | 137/884 |
| 2004/0118466 A1 | * | 6/2004 | Ford et al. | 137/884 |

FOREIGN PATENT DOCUMENTS

EP      0 519 202 A1    12/1992

OTHER PUBLICATIONS

EP Search Report dated Mar. 22, 2005, #04027666.9-2214.

* cited by examiner

*Primary Examiner*—Dean A. Reichard
*Assistant Examiner*—Hoa C. Nguyen
(74) *Attorney, Agent, or Firm*—Anna M. Shih; Roger A. Johnston

(57) ABSTRACT

A lead frame has slots therein for bayonet type connection to electrical terminals provided on a solenoid valve or group of valves. Projections on the lead frame are disposed between the slots and upon bayonet connection to the terminals closely interfit a web disposed between the terminals on the solenoid. Preferably, support stanchions are provided for the terminals and may be integrally molded with the web.

10 Claims, 4 Drawing Sheets

CONNECTING A SOLENOID TO A LEAD FRAME

BACKGROUND OF THE INVENTION

The present invention relates to making an electrical connection to a solenoid and particularly a solenoid operated valve where it is desired to provide for direct plug in or bayonet-type connection. This technique is preferred for making electrical connection to a solenoid where a plurality of solenoid operated valves are disposed on a manifold and arranged for individually controlling an outlet pressure signal to a plurality of outlets on the manifold for control purposes. Such an arrangement of plural valves on a manifold is found in control modules for automatic speed change power transmissions as, for example, automatic transmissions employed in motor vehicles and particularly passenger cars and light trucks.

Heretofore, automatic transmission control modules having plural valves mounted on a manifold for controlling individual pressure signals to a plurality of control signal outlets have employed an electrical lead frame which was commonly assembled over bayonet-type terminals provided on each valve solenoid to facilitate rapid assembly of the module in high volume production as required for automotive applications. However, problems have been encountered in vehicle service with failure of the terminal connection encountered when the module with the valves thereon is attached to the vehicle transmission and is subjected to vibrations from the engine and inertial loads imposed during vehicle operation. Thus, it has long been desired to provide a way or means of simultaneously connecting a plurality of solenoid operated valves to an electrical lead frame in a manner which was sufficiently robust to withstand the vibration encountered in automotive automatic transmission applications on motor vehicles.

BRIEF SUMMARY OF THE INVENTION

The present invention provides the electrical terminals on a solenoid operated valve with support stanchions molded therearound and a web is disposed therebetween, which web is engaged on opposite sides thereof by a pair of stanchions provided on an electrical lead frame which is engaged by bayonet connection with the terminals. In the preferred practice, the stanchions are integrally formed with the lead frame; and, the terminal stanchions and web are integrally molded with the solenoid component structure. In one embodiment, a plurality of valves on a manifold each have their terminals bayonet connected to a common lead frame.

DETAILED DESCRIPTION OF THE INVENTION

Figure 1:
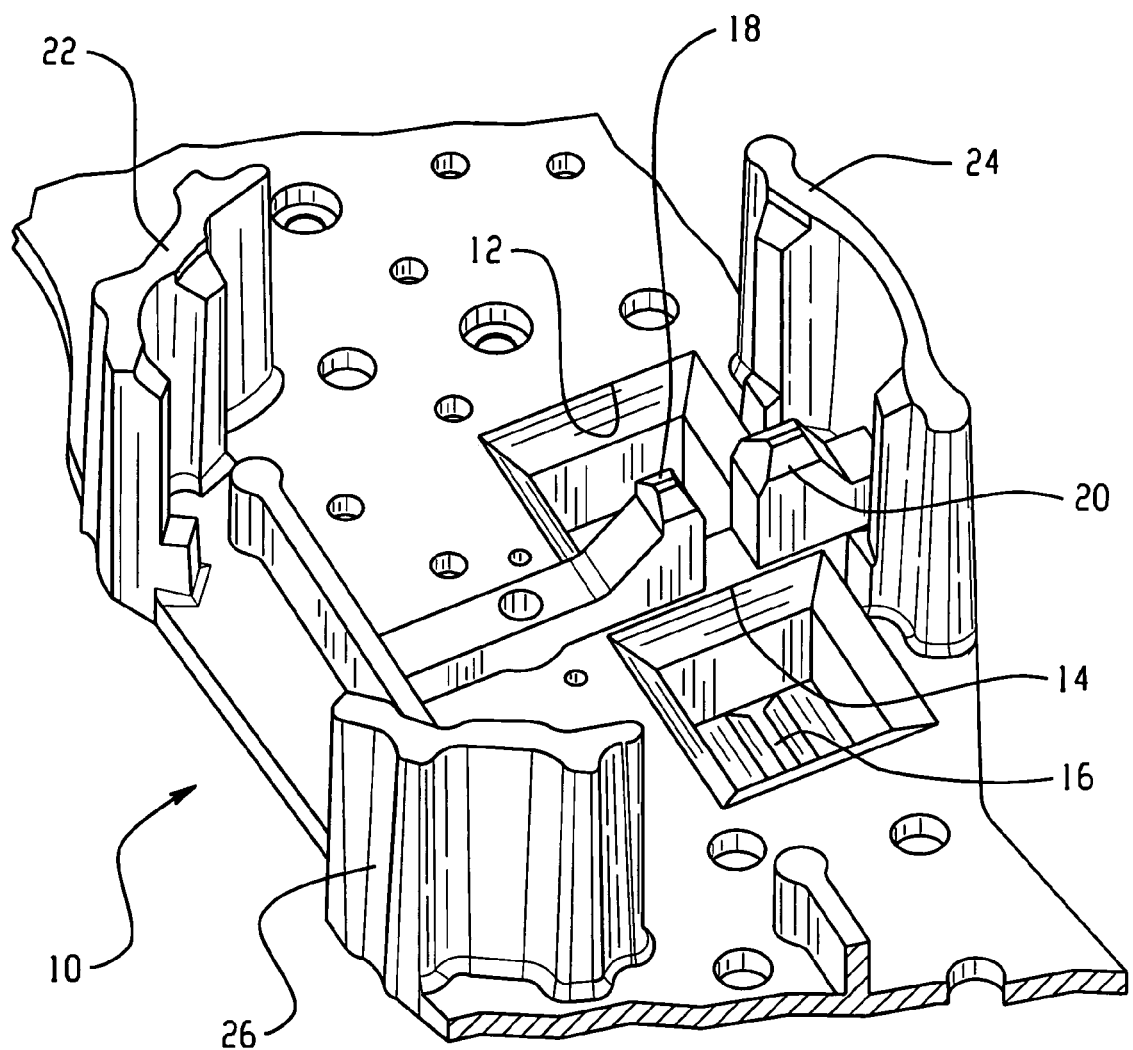
FIG. 1 is a perspective view of a portion of the electrical lead frame of the present invention.

Referring to FIG. 1, an electrical lead frame indicated generally at 10 has a first and second cutout 12, 14 formed therein in spaced relationship, each having a slot such as slot 16 formed in the access 14, which slot is formed in an electrically conductive member and adapted for making electrical connection to circuitry (not shown) within the lead frame. Although not visible in FIG. 1, it will be understood that a similar slot is formed in the recess or opening 12.

Disposed between the openings 12, 14 are a pair of upstanding lugs or projections 18, 20 which are spaced a predetermined distance apart for facilitating assembly as will hereinafter be described. Lead frame 10 also includes guide lugs 22, 24, 26 disposed in spaced arrangement as shown in FIG. 1 and which may be formed integrally with the lead frame for guiding assembly of the valve as will hereinafter be described. Although only a pair of recesses 12, 14 for electrical connection are illustrated in FIG. 1, it will be understood that the remaining portions of the lead frame (not shown) will have additional pairs of recesses and slots for electrical connection of more than one valve to the lead frame.

Figure 2:
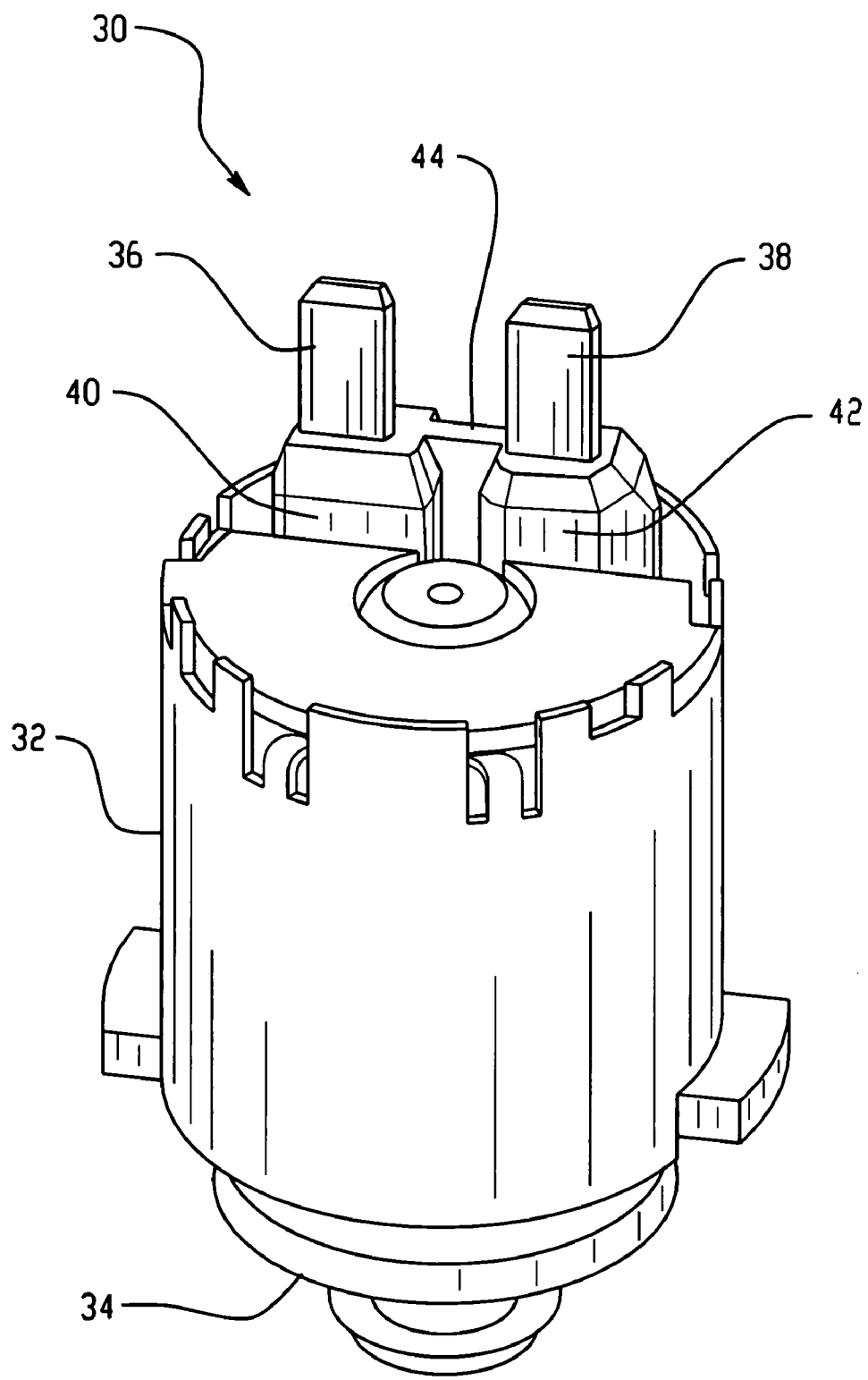
FIG. 2 is a perspective view of the solenoid valve on the present invention illustrating the electrical terminals, stanchions and web.

Referring to FIG. 2, a solenoid operated valve indicated generally at 30 includes a solenoid 32 attached to a valve body 34 for, upon electrical energization, effecting operation of the valve. The solenoid 32 has a pair of upstanding spaced connector terminal 36, 38 which extend upwardly from the solenoid in generally spaced parallel arrangement as is well known in the art.

The terminals 36, 38 are preferably supported by stanchions respectively 40, 42 which may be integrally molded with the solenoid coil bobbin flange or other component of the solenoid.

The stanchions 40, 42 have disposed therebetween a web 44 which in the presently preferred practice is integrally molded with the stanchions 40, 42. The web is sized and configured to closely interfit in the space between the projections 18, 20 on the lead frame; and, thus provides additional support upon bayonet assembly of the terminals 36, 38 into the slots, such as slot 16, upon assembly of the solenoid 30 to the lead frame 10.

In the presently preferred practice of the invention, the stanchions 36, 38 and web 44 are formed of molded plastic material of suitable strength as, for example, glass filled polyamide material, to provide resistance against vibration and inertial loads encountered in automotive power transmission applications.

It will be understood that the guide lugs 22, 24, 26 are disposed and arranged to slidably engage the exterior of the solenoid 32 upon assembly of the solenoid to the lead frame for more accurately locating the lead frame over the solenoid. It will be understood that lead frame 10 may have a plurality of lug sets such as 22, 24, 26, with each set for locating one of a group of solenoids so as to position and locate the lead frame on the solenoids.

Figure 3:
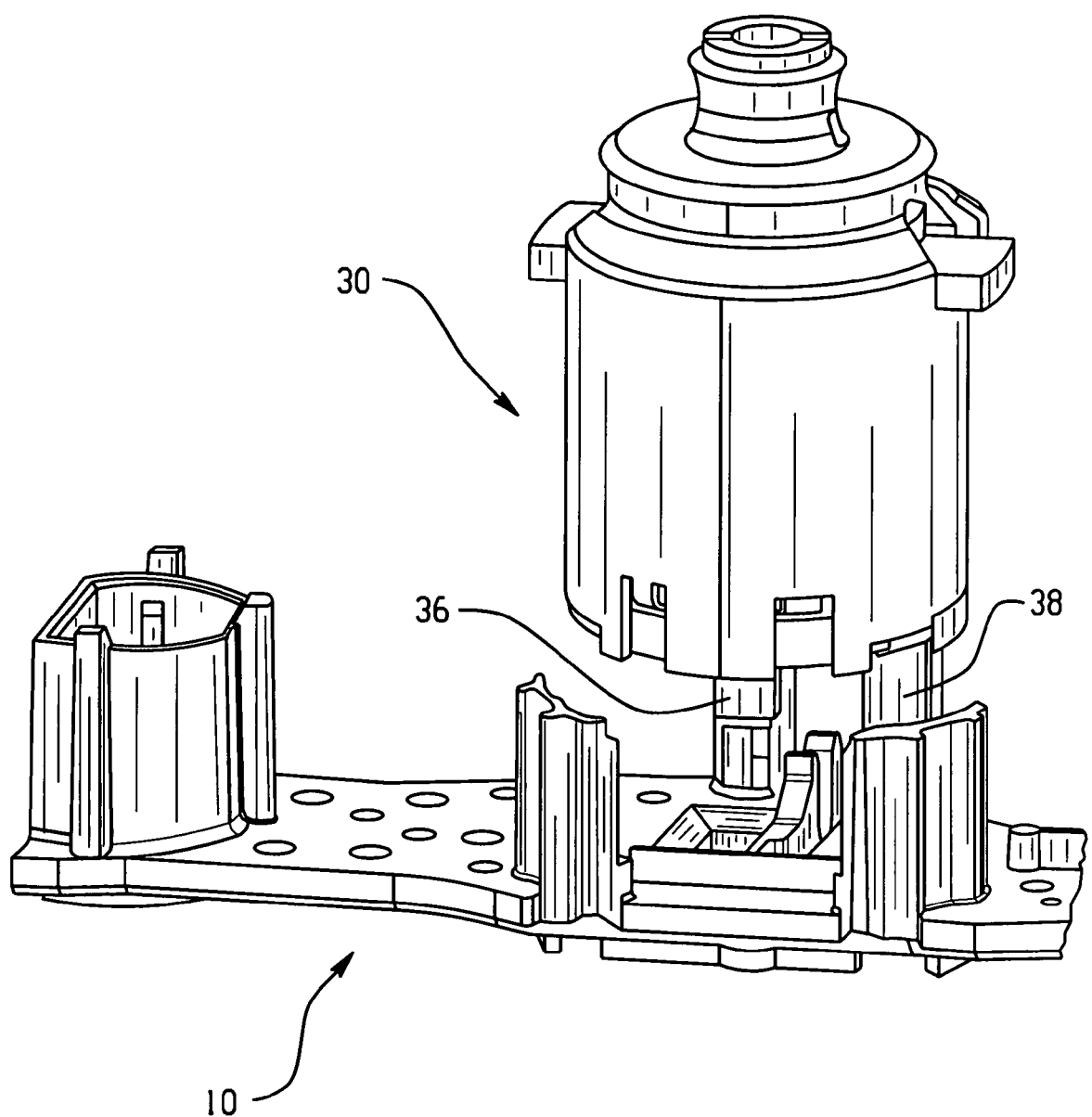
FIG. 3 is an exploded view of the assembly of the valve onto the lead frame; and, FIG. 4 is another exploded view of the assembly taken from the end of the lead frame.
Figure 4:
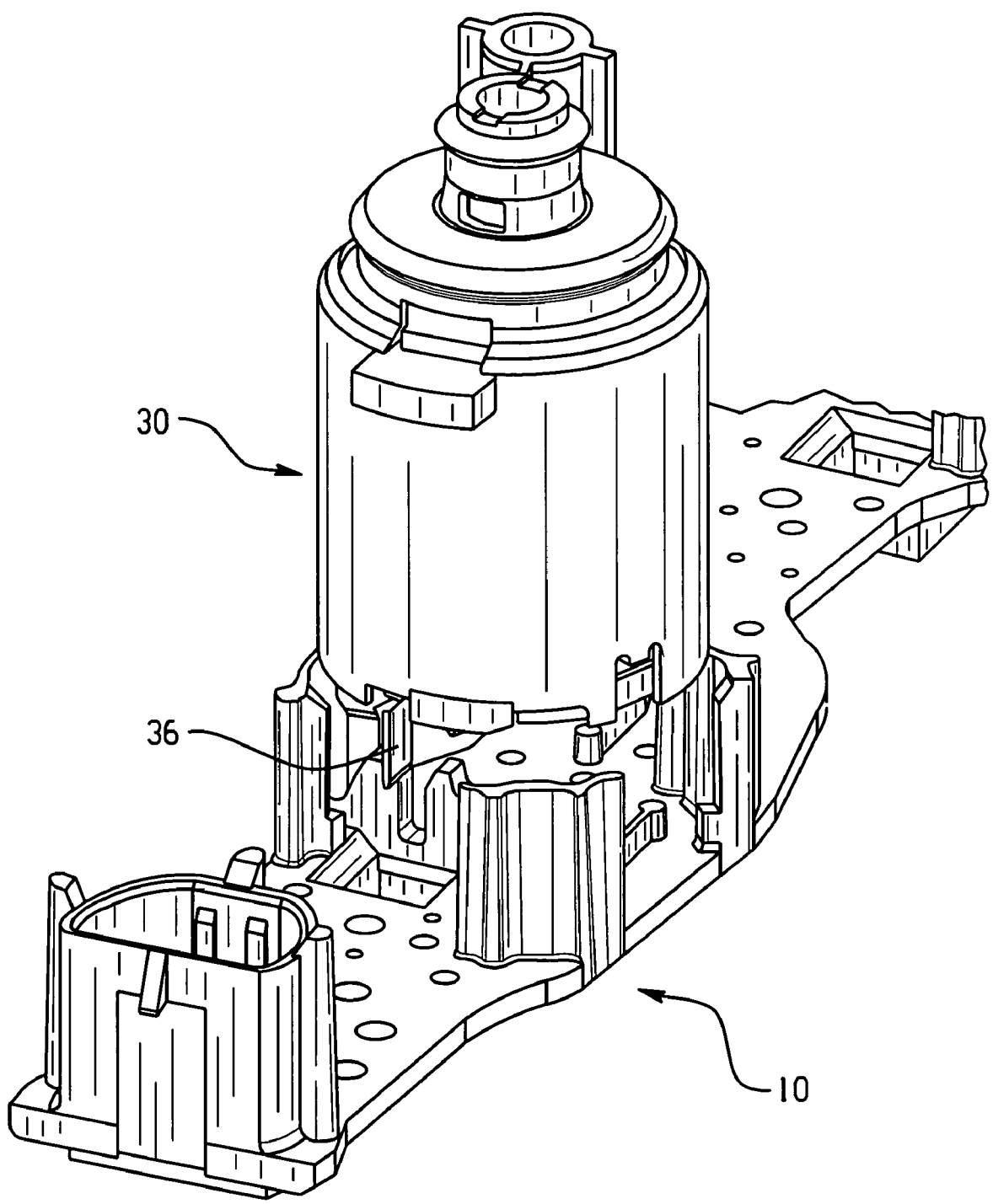

Referring to FIGS. 3 and 4, the arrangement of the lead frame with respect to the solenoid prior to assembly is shown in exploded view.

Thus, the present invention provides a simple and cost effective technique for providing additional support and robustness to the connection of an electrical lead frame to a solenoid or group of solenoids which is suitable for severe environment applications, as for example, automotive power transmission applications.

Although the invention has hereinabove been described with respect to the illustrated embodiments, it will be understood that the invention is capable of modification and variation and is limited only by the following claims.

What is claimed is:

1. In combination a solenoid and lead frame assembly comprising:
   (a) a plurality of connector terminals with a web disposed between a first and second of said terminals;
   (b) a lead frame with a pair of discrete projections thereon and a pair of slots each located to correspond to one of said first and second terminals; and
   (c) said lead frame slots engage said terminals with said pair of discrete projections engaging opposite sides of said web.

2. The assembly defined in claim 1, wherein said projections are integrally formed with said lead frame.

3. The assembly defined in claim 2, wherein said projections and said lead frame are integrally molded.

4. The assembly defined in claim 1, wherein said terminals include support stanchions.

5. The assembly defined in claim 4, wherein said support stanchions are integrally molded with said lead frame.

6. The assembly defined in claim 4, wherein said web is integrally formed with said support stanchions.

7. The assembly defined in claim 4, wherein said web and said stanchions are integrally molded with said lead frame.

8. The assembly defined in claim 1, wherein said web is integrally formed with said lead frame.

9. The assembly defined in claim 8, wherein said web and said lead frame are integrally molded.

10. The assembly defined in claim 1, wherein said projections are disposed intermediate said slots.

* * * * *